(12) United States Patent
Chiu et al.

(10) Patent No.: US 12,733,321 B2
(45) Date of Patent: Sep. 8, 2026

(54) PIXEL STRUCTURE

(71) Applicant: AUO Corporation, Hsinchu (TW)

(72) Inventors: Kuan-Lin Chiu, Hsinchu (TW); Han-Chung Lai, Hsinchu (TW); Cheng-Han Chung, Hsinchu (TW); Yu-Cheng Chang, Hsinchu (TW)

(73) Assignee: AUO Corporation, Hsinchu City (CN)

( * ) Notice: Subject to any disclaimer, the term of this patent is extended or adjusted under 35 U.S.C. 154(b) by 369 days.

(21) Appl. No.: 18/389,813

(22) Filed: Dec. 20, 2023

(65) Prior Publication Data

US 2025/0176334 A1 May 29, 2025

(30) Foreign Application Priority Data

Nov. 28, 2023 (TW) ................................ 112146094

(51) Int. Cl.
*H10H 20/857* (2025.01)
*H10W 90/00* (2026.01)

(52) U.S. Cl.
CPC .......... *H10H 20/857* (2025.01); *H10W 90/00* (2026.01)

(58) Field of Classification Search
CPC ............................ H10H 20/857; H10W 90/00
USPC ............................................................ 257/91
See application file for complete search history.

(56) References Cited

U.S. PATENT DOCUMENTS

| | | | | |
|---|---|---|---|---|
| 10,840,407 B2 * | 11/2020 | Chen | ..................... | H10W 72/90 |
| 2020/0373281 A1 * | 11/2020 | Ruan | ..................... | H10W 90/00 |
| 2022/0392876 A1 * | 12/2022 | Hsieh | .................... | H10W 90/00 |
| 2025/0379191 A1 * | 12/2025 | Rim | .................... | H10W 20/023 |

* cited by examiner

*Primary Examiner* — Jami Valentine Miller
(74) *Attorney, Agent, or Firm* — JCIPRNET

(57) ABSTRACT

A pixel structure includes conductive patterns, a first insulating layer, bonding pads, and light emitting elements. The first insulating layer has contacts overlapping the conductive patterns respectively. The bonding pads are disposed on the first insulating layer and are electrically connected to the conductive patterns through the contact of the first insulating layer respectively. The light emitting elements are electrically connected to the bonding pads respectively. The light emitting elements include a first light emitting element and a second light emitting element. The bonding pads include a first bonding pad and a second bonding pad electrically connected to the first light emitting element and the second light emitting element respectively. The contacts include a first contact and a second contact overlapping with the first bonding pad and the second bonding pad respectively. An area of the first contact is different from an area of the second contact.

6 Claims, 2 Drawing Sheets

PIXEL STRUCTURE

CROSS-REFERENCE TO RELATED APPLICATION

This application claims the priority benefit of Taiwan application serial no. 112146094, filed on Nov. 28, 2023. The entirety of the above-mentioned patent application is hereby incorporated by reference herein and made a part of this specification.

BACKGROUND

Technical Field

The disclosure relates to a pixel structure.

Description of Related Art

A light emitting diode display panel includes a driving backplane and multiple light emitting diode elements placed on the driving backplane. Having the characteristics of a light emitting diode, the light emitting diode display panel has the advantages of power saving, high efficiency, high brightness, and fast response time. In addition, compared with an organic light emitting diode display panel, the light emitting diode display panel further has the advantages of easy color adjustment, long luminous life, and no image imprinting. Therefore, the light emitting diode display panel is regarded as the next generation of the display technology.

Generally speaking, in the manufacturing process of the light emitting diode display panel, a laser bonding technology can be used to melt solder, so that the electrode of the light emitting diode element is bonded to the bonding pad set of the driving backplane. During the laser bonding process, the laser forms a light source and simultaneously illuminates the plurality of light emitting diode elements emitting various color lights. However, the most suitable laser powers for the light emitting diode elements configured to emit various color lights are different, resulting in varying degrees of darkness points in the plurality of light emitting diode elements configured to emit various color lights after the completion of the laser bonding process. The process margin of the laser bonding is small, and the bonding yield is low.

SUMMARY

The disclosure provides a pixel structure which has a high bonding yield.

The pixel structure of the disclosure includes multiple conductive patterns, a first insulating layer, multiple bonding pads, and multiple light emitting elements. The first insulating layer is disposed on the plurality of conductive patterns and has multiple contacts overlapping with the plurality of conductive patterns respectively. The plurality of bonding pads are disposed on the first insulating layer and are electrically connected to the plurality of conductive patterns through the plurality of contacts of the first insulating layer respectively. The plurality of light emitting elements are electrically connected to the plurality of bonding pads respectively. The plurality of light emitting elements include a first light emitting element and a second light emitting element configured to emit a first color light and a second color light respectively. The first color light and the second color light are different from each other. The plurality of bonding pads include a first bonding pad and a second bonding pad electrically connected to the first light emitting element and the second light emitting element respectively. The plurality of contacts include a first contact and a second contact overlapping with the first bonding pad and second bonding pad respectively. An area of the first contact is different from an area of the second contact.

DESCRIPTION OF THE EMBODIMENTS

Figure 1:
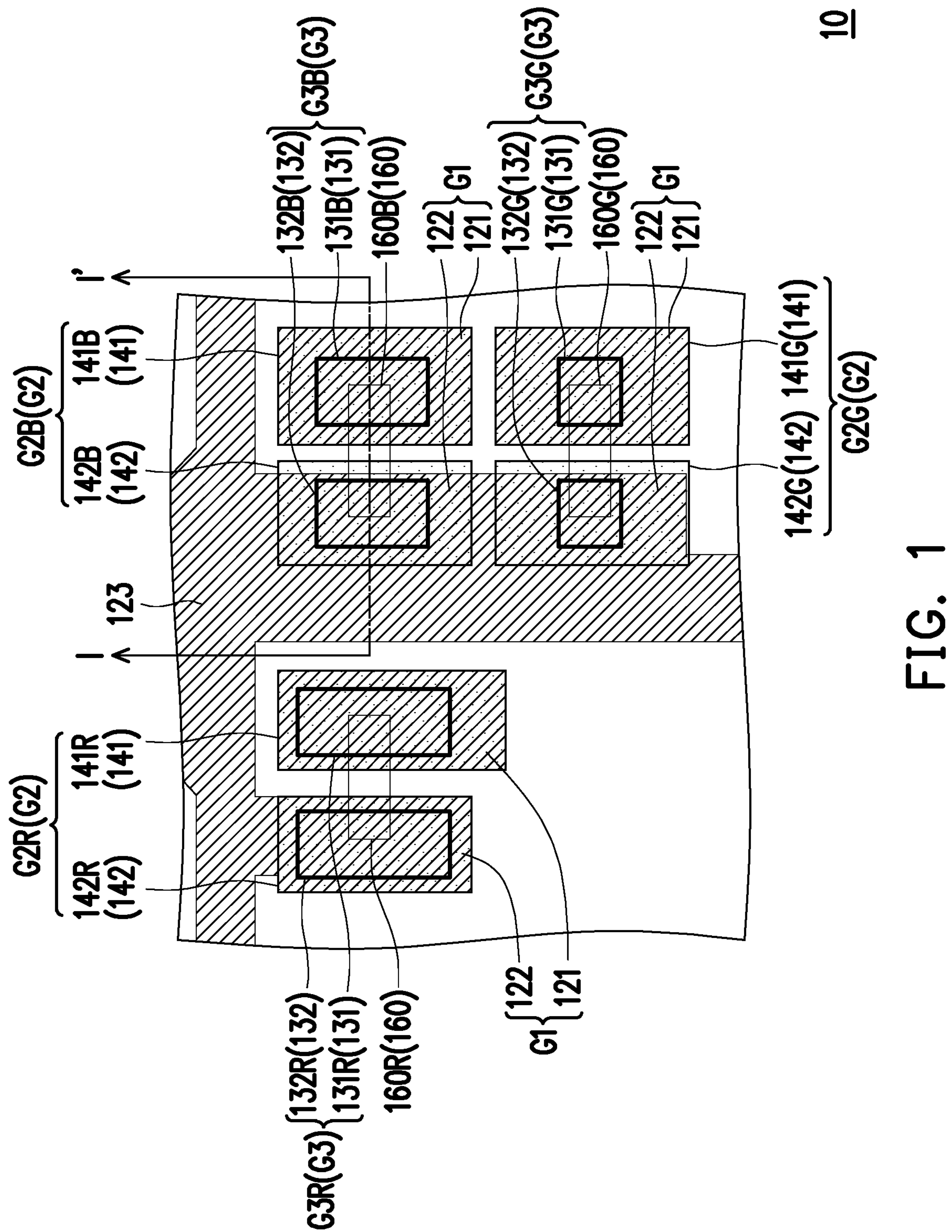
FIG. 1 is a schematic top view of a pixel structure according to an embodiment of the disclosure.

Reference will now be made in detail to the exemplary embodiments of the disclosure, examples of which are illustrated in the accompanying drawings. Whenever possible, the same reference numbers are used in the drawings and descriptions to refer to the same or similar parts.

It should be understood that when an element such as a layer, a film, a region or a substrate is referred to as being "on" or "connected" to another element, it may be directly on or connected to the another element, or intervening elements may also be present. In contrast, when an element is referred to as being "directly on" or "directly connected to" another element, there are no intervening elements present. As used herein, "connection" may refer to a physical and/or electrical connection. In addition, an "electrical connection" or "coupling" may be the another element between two elements.

As used herein, "about," "approximately," or "substantially" is inclusive of the stated value and means within an acceptable range of deviation for the particular value as determined by one of ordinary skill in the art, considering the measurements in question and the error associated with measurement of the particular quantity (that is, the limitations of the measurement system). For instance, "about" can mean within one or more standard deviations, or within ±30%, ±20%, ±10%, ±5% of the stated value. Further, as used herein, "about," "approximately," or "substantially" may depend on optical properties, etch properties, or other properties to select a more acceptable range of deviations or standard deviations without one standard deviation for all properties.

Unless otherwise defined, all terms (including technical and scientific terms) used herein have the same meaning as commonly understood by one of ordinary skill in the art to which the disclosure belongs. It will be further understood that terms such as those defined in commonly used dictionaries should be interpreted as having a meaning that is consistent with their meanings in the context of the relevant art and the disclosure, and will not to be interpreted in an idealized or overly formal sense unless expressly so defined herein.

Figure 2:
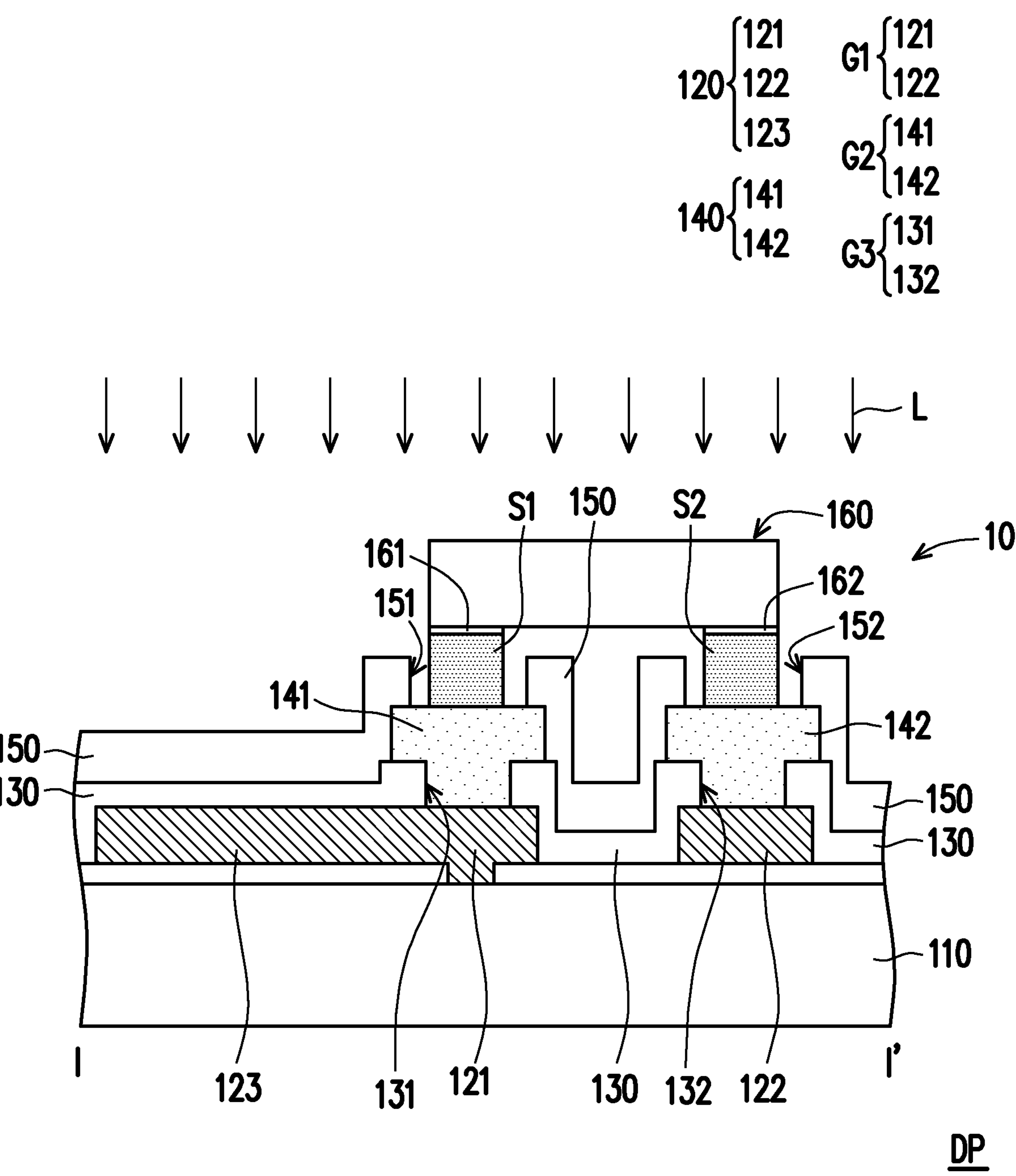
FIG. 2 is a schematic cross-sectional view of a display panel according to an embodiment of the disclosure.

FIG. 1 is a schematic top view of a pixel structure according to an embodiment of the disclosure. FIG. 2 is a schematic cross-sectional view of a display panel according to an embodiment of the disclosure. FIG. 2 corresponds to a section line I-I in FIG. 1.

Referring to FIG. 1 and FIG. 2, a display panel DP includes a substrate 110 and a pixel structure 10 disposed on the substrate 110. The substrate 110 includes a carrier base (not shown) and a driving circuit layer (not shown) disposed on the carrier base, and the pixel structure 10 is electrically connected to the driving circuit layer of the substrate 110.

The pixel structure 10 includes a first conductive layer 120 disposed on the substrate 110, a first insulating layer 130 disposed on the first conductive layer 120, and a second conductive layer 140 disposed on the first insulating layer 130. The first insulating layer 130 is located between the second conductive layer 140 and the first conductive layer 120.

The first conductive layer 120 includes multiple conductive pattern sets G1 and a connection pattern 123. Each conductive pattern set G1 includes multiple conductive patterns 121 and 122. In an embodiment, the conductive pattern 121 of each conductive pattern set G1 may be in an island shape. That is, the conductive patterns 121 of the conductive pattern sets G1 are electrically independent from each other. In an embodiment, the second conductive patterns 122 of the conductive pattern sets G1 are directly connected to the same connection pattern 123. That is, the second conductive patterns 122 are connected in series with each other. For example, in an embodiment, a material of the first conductive layer 120 may be metal, alloy or a combination thereof, but the disclosure is not limited thereto.

The first insulating layer 130 is disposed on the conductive patterns 121 and 122 of the first conductive layer 120 and has multiple contact sets G3 overlapping with the conductive pattern sets G1 respectively. Each contact set G3 includes multiple contacts 131 and 132 overlapping with multiple conductive patterns 121 and 122 of a corresponding conductive pattern set G1 respectively. In an embodiment, a material of the first insulating layer 130 may be an inorganic material (such as silicon oxide, silicon nitride, silicon oxynitride or a stacked layer of at least two of the aforementioned materials), an organic material or a combination thereof.

The second conductive layer 140 includes multiple bonding pad sets G2. Each bonding pad set G2 includes multiple bonding pads 141 and 142 disposed on the first insulating layer 130. The bonding pads 141 and 142 of each bonding pad set G2 are electrically connected to the conductive patterns 121 and 122 of the corresponding conductive pattern set G1 through the contacts 131 and 132 of a corresponding contact set G3 respectively.

The pixel structure 10 further includes multiple light emitting elements 160. For example, in an embodiment, the light emitting elements 160 of the pixel structure 10 may include a first light emitting element 160R, a second light emitting element 160B, and a third light emitting element 160G. The first light emitting element 160R, the second light emitting element 160B, and the third light emitting element 160G are configured to emit first color light, second color light, and third color light respectively, the first color light, the second color light, and the third color light being different from each other. For example, in an embodiment, the first color light, the second color light, and the third color light are, for example, red light, blue light, and green light respectively, but the disclosure is not limited thereto. In an embodiment, the light emitting element 160 is, for example, a micro light emitting diode (LED), but the disclosure is not limited thereto.

Each light emitting element 160 has multiple electrodes 161 and 162. The electrodes 161 and 162 of each light emitting element 160 are electrically connected to the corresponding bonding pads 141 and 142 of the bonding pad set G2 respectively. Specifically, in this embodiment, the pixel structure 10 further includes a second insulating layer 150 disposed on the second conductive layer 140. The second insulating layer 150 has multiple openings 151 and 152 overlapping with the bonding pads 141 and 142 respectively. The electrodes 161 and 162 of the light emitting element 160 may be electrically connected to the bonding pads 141 and 142 through multiple solders S1 and S2 (including, but not limited to, tin) located in the openings 151 and 152 respectively. In an embodiment, a laser bonding process may be used to bond the light emitting element 160 and the bonding pad set G2. In an embodiment, laser L used in the laser bonding process may form a surface light source to illuminate all the light emitting elements 160 of the pixel structure 10 at the same time.

The bonding pad sets G2 include a first bonding pad set G2R, a second bonding pad set G2B, and a third bonding pad set G2G electrically connected to the first light emitting element 160R, the second light emitting element 160B, and the third light emitting element 160G respectively. The bonding pads 141 and 142 of the first bonding pad set G2R may be called multiple first bonding pads 141R and 142R. The bonding pads 141 and 142 of the second bonding pad set G2B may be called multiple bonding pad sets 141B and 142B. The bonding pads 141 and 142 of the third bonding pad set G2G may be called multiple third bonding pads 141G and 142G. The contact sets G3 include a first contact set G3R, a second contact set G3B, and a third contact set G3G overlapping with the first bonding pad set G2R, the second bonding pad set G2B, and the third bonding pad set G2G respectively. The contacts 131 and 132 of the first contact set G3R may be called multiple first contacts 131R and 132R. The first bonding pads 141R and 142R of the first bonding pad set G2R overlap with the first contacts 131R and 132R respectively and are electrically connected to the corresponding conductive patterns 121 and 122 of the conductive pattern set G1 through the first contacts 131R and 132R respectively. The contacts 131 and 132 of the second contact set G3B may be called multiple second contacts 131B and 132B. The second bonding pads 141B and 142B of the second bonding pad set G2B overlap with the second contacts 131B and 132B respectively and are electrically connected to the corresponding conductive patterns 121 and 122 of the conductive pattern set G1 through the second contacts 131B and 132B respectively. The contacts 131 and 132 of the third contact set G3G may be called multiple third contacts 131G and 132G. The third bonding pads 141G and 142G of the third bonding pad set G2G overlap with the third contacts 131G and 132G respectively and are electrically connected to the corresponding conductive patterns 121 and 122 of the conductive pattern set G1 through the third contacts 131G and 132G respectively.

An area of the first contact 131R/132R is different from an area of the second contact 131B/132B. That is, a contact area between the first bonding pad 141R/142R and the corresponding conductive pattern 121/122 is different from a contact area between the second bonding pad 141B/142B and the corresponding conductive pattern 121/122. In this way, when the surface light source formed by the laser L irradiates the first light emitting element 160R and the second light emitting element 160B at the same time, the difference of the contact area between the first bonding pad 141R/142R and the conductive pattern 121/122 and the contact area between the second bonding pad 141B/142B and the conductive pattern 121/122 may make up for the difference of the absorption rate of the first light emitting element 160R for the laser L and the second light emitting element 160B for the laser L. Thus, the bonding conditions of the first light emitting element 160R and the second light emitting element 160B are consistent, and the processing margin of the laser bonding is increased.

In an embodiment, the absorption rate of the first light emitting element 160R for the laser L is lower than the absorption rate of the second light emitting element 160B for the laser L, and the area of the first contact 131R/132R is larger than the area of the second contact 131B/132B. In an embodiment, the absorption rate of the second light emitting element 160B for the laser L is lower than the absorption rate of the third light emitting element 160G for the laser L, and the area of the second contact 131B/132B is larger than the area of the third contact 131G/132G.

In an embodiment, the area of the first contact 131R/132R is set as $A_R$, the area of the second contact 131B/132B is set as $A_B$, and $0.5 \cdot A_R \leq A_B \leq 0.9 \cdot A_R$, but the disclosure is not limited thereto. In an embodiment, the area of the third contact 131G/132G is set as $A_G$, and $0.4 \cdot A_R \leq A_G \leq 0.6 \cdot A_R$, but the disclosure is not limited thereto.

In an embodiment, the area of the first contact 131R/132R is set as $A_R$, the area of the second contact 131B/132B is set as $A_B$, and $$\frac{A_R - A_B}{A_R} > 20\%,$$

but the disclosure is not limited thereto. In an embodiment, the area of the first contact 131R/132R is set as $A_R$, the area of the third contact 131G/132G is set as $A_G$, and $$\frac{A_R - A_G}{A_R} > 20\%,$$

but the disclosure is not limited thereto.

What is claimed is:

1. A pixel structure, comprising:

a plurality of conductive patterns;

a first insulating layer, disposed on the plurality of conductive patterns and having a plurality of contacts overlapping with the plurality of conductive patterns respectively;

a plurality of bonding pads, disposed on the first insulating layer and electrically connected to the plurality of conductive patterns through the plurality of contacts of the first insulating layer respectively; and a plurality of light emitting elements, electrically connected to the plurality of bonding pads respectively, wherein the plurality of light emitting elements comprise a first light emitting element and a second light emitting element, the first light emitting element and the second light emitting element are respectively configured to emit a first color light and a second color light, the plurality of bonding pads comprise a first bonding pad and a second bonding pad, the first bonding pad and the second bonding pad are respectively electrically connected to the first light emitting element and the second light emitting element, the plurality of contacts comprise a first contact and a second contact, and the first contact and the second contact respectively overlap with the first bonding pad and the second bonding pad, wherein an absorption rate of the first light emitting element is lower than an absorption rate of the second light emitting element, and an area of the first contact is larger than an area of the second contact, and wherein the plurality of light emitting elements further comprise a third light emitting element, the third light emitting element is configured to emit a third color light, the first color light, the second color light, and the third color light are different from each other, the plurality of bonding pads further comprise a third bonding pad, the third bonding pad is electrically connected to the third light emitting element, the plurality of contacts further comprise a third contact overlapping with the third bonding pad, the absorption rate of the second light emitting element is lower than an absorption rate of the third light emitting element, and the area of the second contact is larger than an area of the third contact.

2. The pixel structure according to claim 1, wherein the first color light and the second color light are red light and blue light respectively.

3. The pixel structure according to claim 2, wherein the third color light is green light.

4. The pixel structure according to claim 3, wherein the area of the first contact is set as $A_R$, the area of the second contact is set as $A_B$, and $0.5 \cdot A_R \leq A_B \leq 0.9 \cdot A_R$.

5. The pixel structure according to claim 4, wherein the area of the third contact is set as $A_G$, and $0.4 \cdot A_R \leq A_G \leq 0.6 \cdot A_R$.

6. The pixel structure according to claim 1, wherein the area of the first contact is set as $A_R$, the area of the second contact is set as $A_B$, and $$\frac{A_R - A_B}{A_R} > 20\%.$$

* * * * *